United States Patent [19]
Pogrebinsky et al.

[11] Patent Number: 5,792,947
[45] Date of Patent: Aug. 11, 1998

[54] METHOD AND APPARATUS FOR COMBINED GLIDE AND DEFECT ANALYSIS

[75] Inventors: Vladimir Pogrebinsky, Campbell; Igor Iosilevsky, Hayward; George A. Burt, Jr., Fremont; David Ferry, Boulder Creek, all of Calif.

[73] Assignee: Phase Metrics, San Diego, Calif.

[21] Appl. No.: 634,693

[22] Filed: Apr. 18, 1996

[51] Int. Cl.⁶ .................. G11B 5/60; G01B 5/28; G01B 17/08
[52] U.S. Cl. .................. 73/105; 360/103; 360/137
[58] Field of Search .................. 324/210, 211, 324/212; 73/104, 105, 660; 360/75, 103, 137

[56] References Cited

U.S. PATENT DOCUMENTS 5,256,965  10/1993  Nomura ..................... 324/212

*Primary Examiner*—Walter E. Snow
*Attorney, Agent, or Firm*—Blakley Sokoloff Taylor & Zafman

[57] ABSTRACT

A method and apparatus for detecting defects on the surface of a data recording medium. In one embodiment the present invention includes a sensor for detecting defects on the surface of a magnetic disk. The sensor generates an analog voltage signal that is representative of a surface anomaly detected on the disk surface. An analog signal processor processes the signal before it is received by a peak detecting circuit. The peak detecting circuit detects and converts a peak of the analog signal into digital data. The digital data is received and manipulated by a digital signal processor where the peak amplitude, average peak amplitude and average peak power of the defect may be calculated.

34 Claims, 6 Drawing Sheets

METHOD AND APPARATUS FOR COMBINED GLIDE AND DEFECT ANALYSIS

FIELD OF THE INVENTION

This invention relates to the field of data recording and more specifically, to a circuit for detecting defects on the surface of a data recording medium.

BACKGROUND OF THE INVENTION

In recent years microcomputer equipment such as personal, desk top or lap top computers have become extremely popular for a wide range of business, educational and recreational uses. Such computers typically include a main central processor having one or more memory storage disks for the storage of data. The storage disk or disks are commonly provided as part of a so-called Winchester disk drive unit, sometimes referred to as a "hard" disk. Hard disk systems typically consist of one or more disks which are mounted and rotated by a common spindle. Each disk contains a plurality of narrow, closely spaced concentric tracks wherein serial data can be magnetically recorded for later recovery by a transducer positioned with respect to the desired track. The transducer is integrated into a slider that is typically gimbal mounted to a flexure which is attached to a rotary arm. The arm is pivoted by a voice coil motor which moves the slider radially across the surface of the magnetic disk from one data track to another. During operation the rotation of the magnetic disk causes the transducer to be hydrodynamically lifted above the surface of the recording medium by an air bearing. This hydrodynamic lifting phenomena results from the flow of air produced by the rotating magnetic disk. It is this air flow which causes the slider to "fly" above the disk surface.

In magnetic recording technology, it is continually desired to improve the density at which information can be recorded and read. The total memory storage capacity or recording density is proportional to the number of tracks on the surface of a disk. The number of tracks is, in turn, dependent upon the width of the tracks which is directly proportional to the air bearing height.

The current trend in the industry is toward increasing storage capacity by lowering the slider flying height. Reducing the slider flying height down to near-contact levels is currently one of the major areas of focus in the modern magnetic storage industry.

In order to achieve lower flying heights, the need to more precisely control the surface conditions of the disks has become increasingly important. A defect or bump on the surface of the disk can degrade or eventually destroy the read/write performance of the head. Any unwanted contact between the head and magnetic surface can also lead to wear and the accumulation of debris on both the slider and the disk causing random signal modulations. In some instances, a surface defect or bump can even result in a crash stop of the head.

During the post-manufacture processing of magnetic hard disks, the surface of the disks are routinely tested for defects. FIG. 1 illustrates one prior art testing apparatus 10 for detecting defects on the surface of a disk. As illustrated, the testing apparatus includes a sensor 12 that generates an analog voltage signal 14 representative of a defect that is detected by the sensor. The analog signal 14 is generally processed through a single-channel analog processing circuit 20. Circuit 20 typically includes a filter 22, an attenuator or other scaling device 24, and a full wave rectifier 26. The circuit may also include a buffer 28 and an amplifier 30. The output signal 32 of circuit 20 is coupled to a digital circuit 40. Circuit 40 includes an analog to digital converter 42, a comparator 44 and a register 46. The non-inverting input of comparator 44 is coupled to the analog circuit output 32. The inverting input is coupled to a threshold voltage, $V_{TH}$, at node 41. The threshold voltage, $V_{TH}$, is preselected and controlled by an operator or computer. Error detection is achieved by comparing analog signal 32 with the preselected threshold voltage, $V_{TH}$. When the value of signal 32 exceeds $V_{TH}$, the comparator generates an output which enables register 46 so that the digitized read signal from converter 42 is latched into the register. The digitized signal is further processed by a computer 50 where the existence of a head to disk interface error (HDI) is determined.

Although the testing apparatus 10 of FIG. 1 is well established, it is extremely limited in its ability to determine the size or characterize the nature of the defect detected. As an example, FIG. 2 illustrates two voltage signals DEFECT1 and DEFECT2, each representative of a defect detected by sensor 12. DEFECT1 represents a short, steep bump, wherein DEFECT2 represents a long, flat bump. $V_{TH}$ represents the preselected threshold voltage that is coupled to the inverting input of comparator 44. In the testing apparatus of FIG. 1, a head to disk interface error will result as DEFECT1 and DEFECT2 voltages exceed the threshold voltage, $V_{TH}$. Note that neither the peak amplitude nor the duration of the defect signal is detectable in the prior art testing apparatus 10. The prior art method simply registers the event when the defect signal exceeds the preselected threshold voltage, $V_{TH}$. Testing apparatus 10 is incapable of determining the peak amplitude, length, or nature of the defect detected.

As mentioned earlier, in order to achieve lower flying heights, the need to more precisely control the surface conditions of a disk has become increasingly important. However, the ability to precisely control the surface conditions is dependent upon the ability to accurately detect and properly characterize the size and nature of the defects detected on the disk's surface. As indicated above, the prior art testing apparatus of FIG. 1 is essentially an event register that logs the occurrence of a head to disk interface error when the defect voltage signal exceeds a preselected threshold voltage. As such, testing apparatus 10 is not well-suited for high density recording applications.

Turning again to FIG. 2, DEFECT1 and DEFECT2 are shown having substantially different frequencies. In the known method of apparatus 10, a single-channel analog processing circuit is used to process essentially every signal generated by sensor 12. As head flying heights diminish, it is important to process and evaluate defect signals over a broader range of frequencies. The use of a single-channel analog processing circuit is undesirable since the accuracy of output signal 32 will vary with the frequency of the signal.

What is needed then is a testing apparatus and circuit that is capable of accurately detecting the defects on the surface of a data recording medium. As will be seen, the present invention provides a method and apparatus for detecting defects on the surface of magnetic disks while overcoming the aforementioned problems.

SUMMARY OF THE INVENTION

A method and apparatus for detecting defects on the surface of a data recording medium is disclosed.

In one embodiment the present invention includes a sensor for detecting defects on the surface of a magnetic disk. The sensor generates an analog voltage signal that is representative of a surface anomaly detected on the disk surface. An analog signal processor processes the signal before it is received by a peak detecting circuit. The peak detecting circuit detects and converts a peak of the analog signal into digital data. The digital data is received and manipulated by a digital signal processor (DSP) where the peak amplitude, average peak amplitude and average peak power of the defect may be calculated.

In another embodiment, the present invention includes an analog signal processor having a plurality of processing channels. Each processing channel receives and processes a particular frequency bandwidth of the analog signal. The analog output of each channel is coupled to a peak detecting circuit which detects and converts a peak value of the analog signal into digital data. The digital data is received by a DSP where the peak amplitude, average peak amplitude and average peak power of the defect may be calculated.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

A method and apparatus for detecting defects on the surface of a data recording medium is described. In the following description, numerous specific details are set forth in order to provide a thorough understanding of the present invention. However, it will be obvious to one of skill in the art that the invention may be practiced without these specific details. In other instances, well known elements and processing techniques have not been shown or described in particular detail in order to avoid unnecessarily obscuring the present invention. In order to illustrate the need for systems that are capable of accurately and reliably detecting defects on a data recording medium, this discussion will mainly be limited to those needs associated with magnetic recording disks. It will be recognized, however, that such focus is for descriptive purposes only and the apparatus of the present invention are applicable to any of a number of surface media testing applications.

Figure 3A:
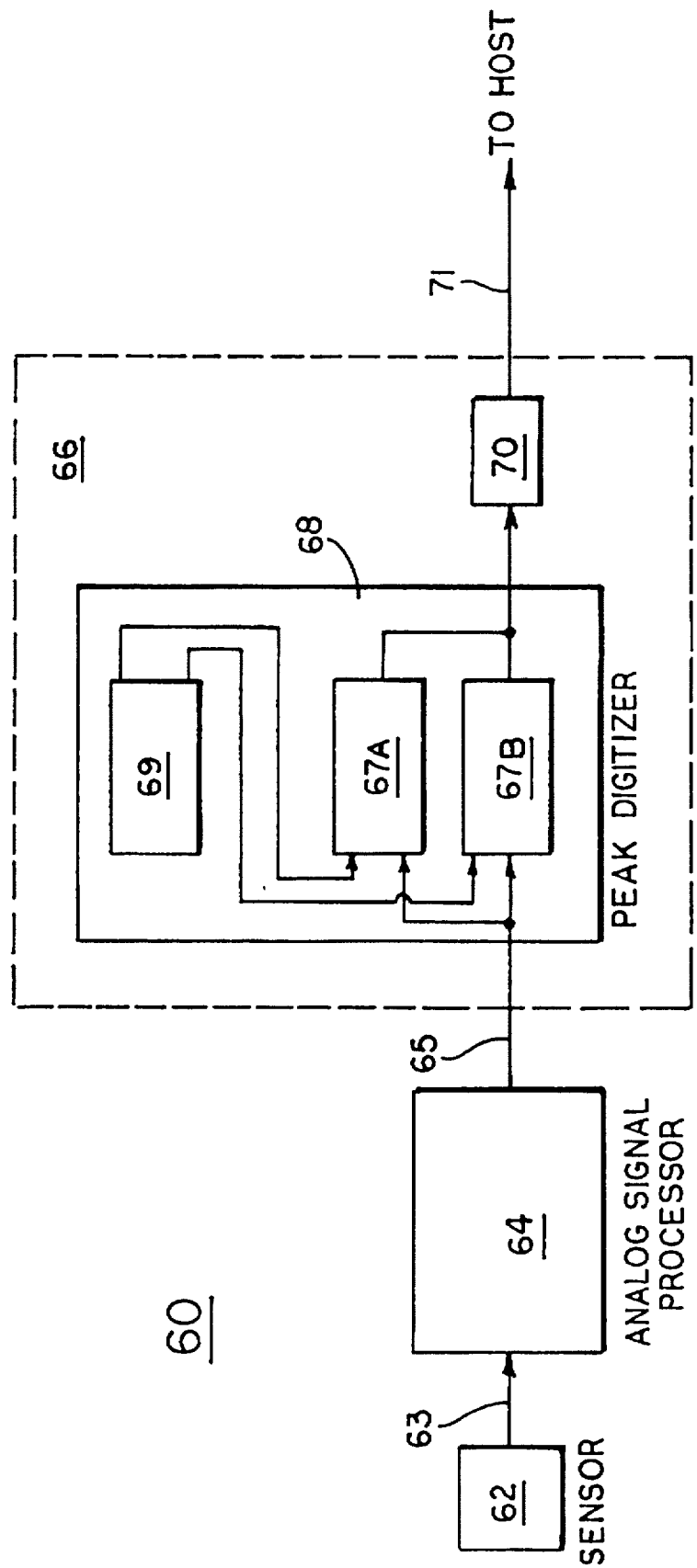
FIG. 3A illustrates a block diagram of one embodiment of the present invention.
Figure 3B:
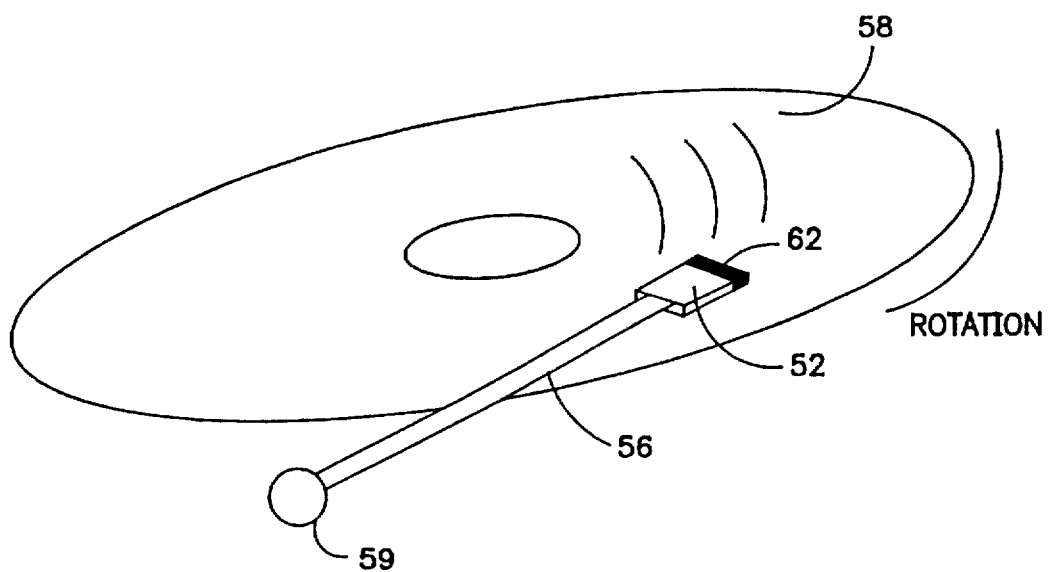
FIG. 3B shows a sensor of the present invention attached to a slider that is riding above the surface of a data recording disk.

FIG. 3A illustrates a circuit 60 for detecting the surface conditions of a data recording medium. In many instances, circuit 60 is used to test for defects along the surface of a magnetic recording disk. The detection circuit 60 of the present invention comprises a sensor 62, an analog circuit 64 and a digital circuit 66. In one embodiment, circuit 66 comprises an analog to digital peak detector 68 and a digital signal processor (DSP) 70. Sensor 62 typically comprises an acoustic emission sensor or a piezo crystal that is coupled to a slider. As shown in FIG. 3B, the sensor 62 may be integrated into a slider 52 that is attached to a rotary arm 56. The arm is pivoted by a rotary actuator 59 which moves the slider and sensor radially across the surface of the magnetic disk 58 from one data track to another. During testing, the rotation of disk 58 causes slider 52 to be hydrodynamically lifted above the surface of the disk. The flying height of the slider will vary depending upon the particular testing and grading requirements of the disk. A defect or head to disk interface error is detected when slider 52 hits or otherwise encounters an asperity (bump) along the surface of disk 58. In response to a "hit", sensor 62 generates an analog voltage signal output 63 that is representative of the size and shape of the asperity. It is appreciated that the mode by which sensor 62 is moved across the surface of disk 58 is not limited by the present invention. A linear actuator assembly, or any other mechanism that is capable of accurately positioning sensor 62 about the surface of disk 58, may be used in the implementation of the present invention.

As mentioned earlier, current testing methods and apparatus are limited in their ability to accurately determine the shape and size of a detected defect. To overcome the limitations imposed by prior art testing methods, the present invention, among other features, utilizes an analog to digital peak detector 68, such as the Flash Peak Detector, Model TDC 1035, manufactured by TRW LSI Products Incorporated. Detector 68 determines and converts a peak of the analog circuit output signal 65 into digital data. In one embodiment, peak detector 68 comprises an array of comparators, an array of Set Reset latches, encoding, output format and output driver circuitry. In one embodiment, a resistor ladder 69 generates evenly spaced threshold levels which are compared simultaneously with an analog input by the comparators 67A, 67B. Each comparator sets its corresponding latch if the analog input exceeds its threshold. The digitized output of each set latch is stored in a peak detector FIFO. The DSP 70 receives the stored digital data and is able to operate on the data such that the average peak amplitude, high peak average amplitude and the average peak power of the defect may be determined. The output 71 of DSP 70 may be coupled to a computer or a variety of other host interfaces to further process the results of the DSP calculations. For example, a grading of the disk surface may be determined based upon the results of the DSP calculations.

The use of peak detector 68 offers a number of advantages over the prior art methods of testing and grading magnetic disks. Most importantly, peak detector 68 provides test circuit 60 with the capability of characterizing the size and shape of the asperities/defects detected on the surface of a data recording medium. By sampling and determining the peak value of the analog signal, the analog to digital peak detector 68 provides more accurate and reliable test data. For example, unlike existing test methods, the present invention is able to establish a defect profile by detecting the actual peak amplitude of the defect. Therefore, in accordance with the present invention, the characteristics of a defect, including peak amplitude (height), length and power level (amplitude multiplied by time), may be determined. As a result, a more accurate depiction of the conditions that exists along the surface of a magnetic disk or other data recording medium may be obtained. It is appreciated that the information produced by the present invention may be used to more effectively grade the surface condition of a recording medium. Moreover, the information obtained by the present invention may be used to evaluate and adjust particular manufacturing processes in order more precisely control the surface conditions of the recording medium. The present invention may also accommodate three-dimensional plotting of the recording medium surface.

Figure 4:
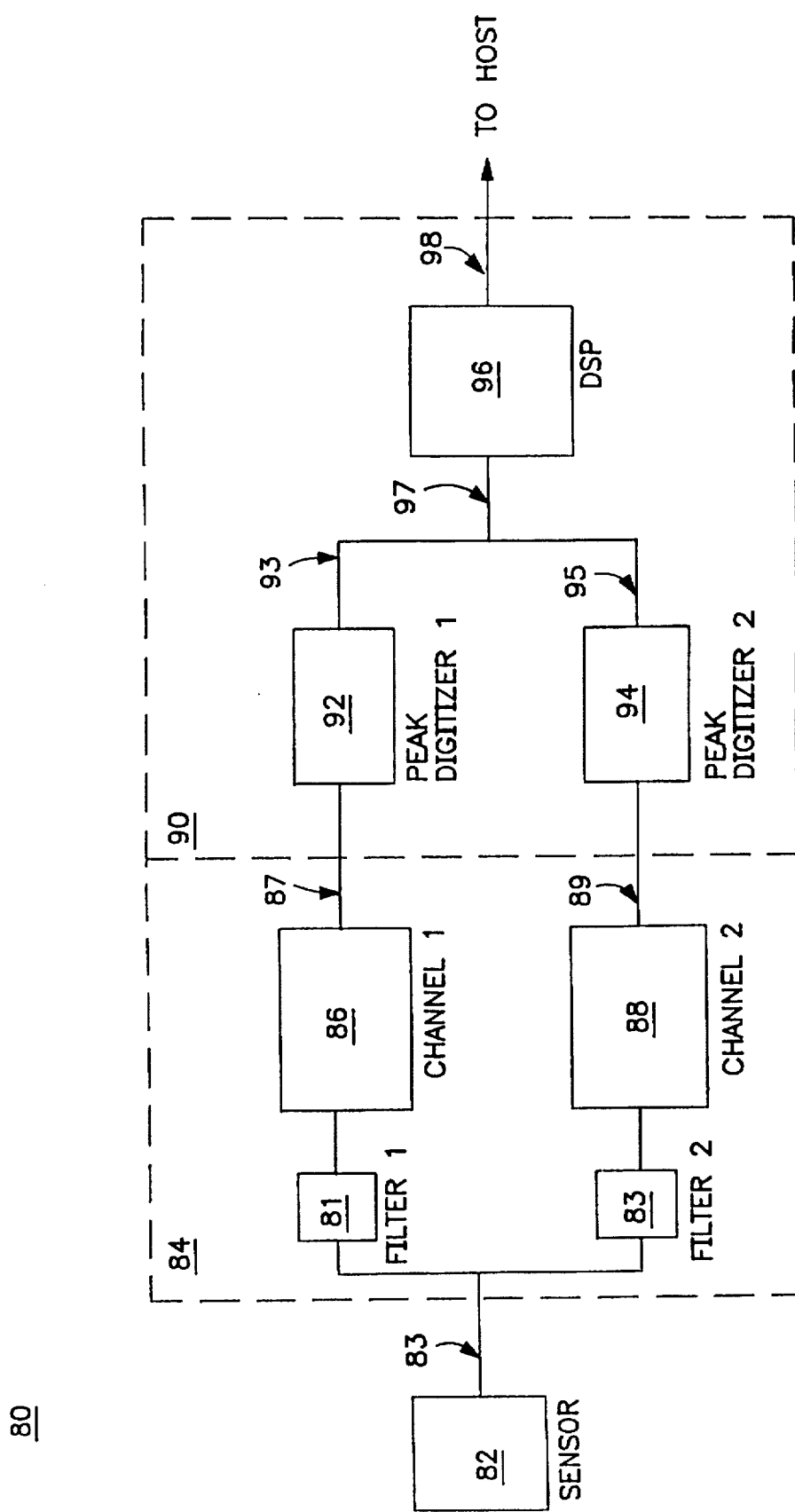
FIG. 4 illustrates a block diagram of another embodiment of the present invention.

As mentioned earlier, the flying height of sliders above the surface of magnetic disks has become extremely low. As a result, the need to address problems associated with error margin and signal detection resolution has increased. The present invention addresses these problems in several ways. As discussed above, the testing apparatus of the present invention includes a peak detecting circuit that provides more accurate and more reliable information that permits a more detailed defect analysis. In another embodiment of the present invention (see FIG. 4), the problems associated with error margin and signal detection resolution are further addressed by providing a plurality of analog circuit processing channels wherein each processing channel receives and processes a particular frequency bandwidth of an analog signal. As illustrated in FIG. 4, test apparatus 80 includes a sensor 82, an analog circuit 84 and a digital circuit 90. Sensor 82 generates an analog signal output 83 that is representative of a defect detected by the sensor. In the embodiment of FIG. 4, signal 83 is received by an analog processing circuit 84 possessing two processing channels 86 and 88. Channels 86 and 88 each process a particular frequency bandwidth of signal 83. The frequency bandwidth processed by each channel is determined by bandpass filters 81 and 83. It is appreciated that the size and shape of a defect will affect the frequency of the analog signal produced by sensor 82. For example, a short, steep defect or bump will produce an analog signal having a relatively high frequency. On the other hand, a long, short defect will produce an analog signal having a relatively low frequency. As previously discussed, as slider/head flying heights diminish, the ability to process and evaluate defect signals over a broader range of frequencies is necessary. The present invention provides the capability of evaluating a broader range of signal frequencies while enhancing the defect signal resolution. Higher signal resolution is accomplished by providing a multitude of signal processing channels wherein the gain stage and calibration components within each channel are individually tailored for a particular frequency band. In one embodiment, channel 86 processes signals in the range of 30–300 KHz and channel 88 processes signals in the range of 600–800 KHz. Although FIG. 4 illustrates a testing apparatus having two channels, it is appreciated that any of a number of additional channels may be incorporated into the device to obtain a desired signal resolution.

Figure 1:
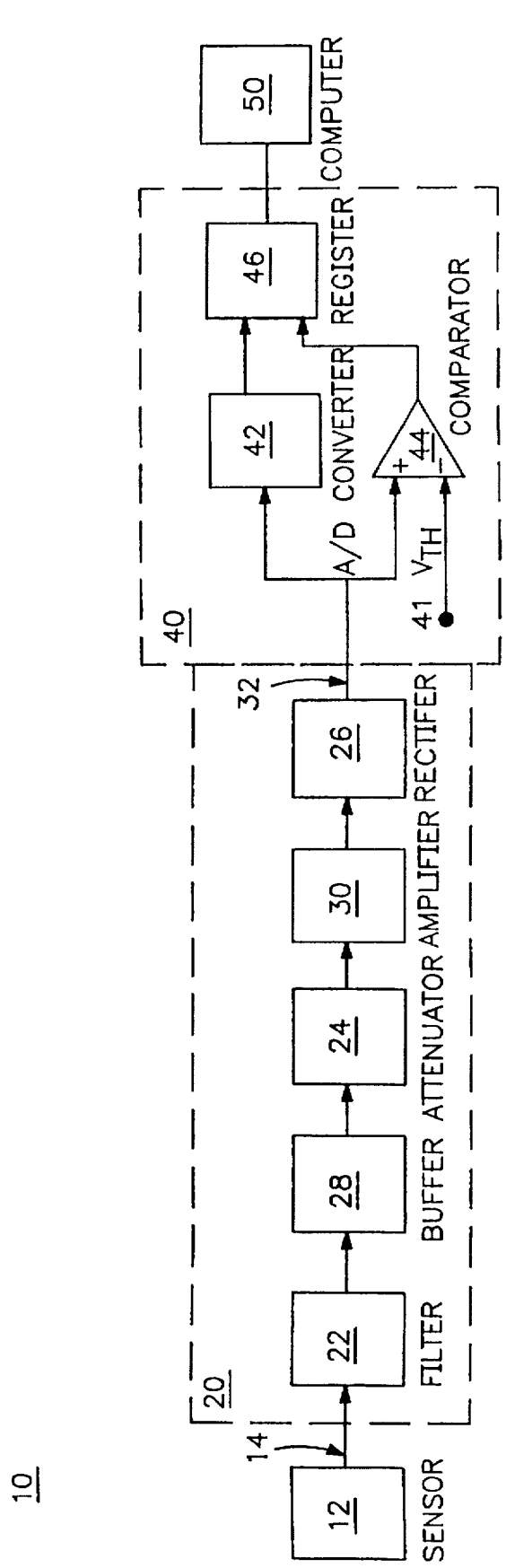
FIG. 1 illustrates a prior art apparatus and circuit used for detecting defects on the surface of a magnetic disk.
Figure 2:
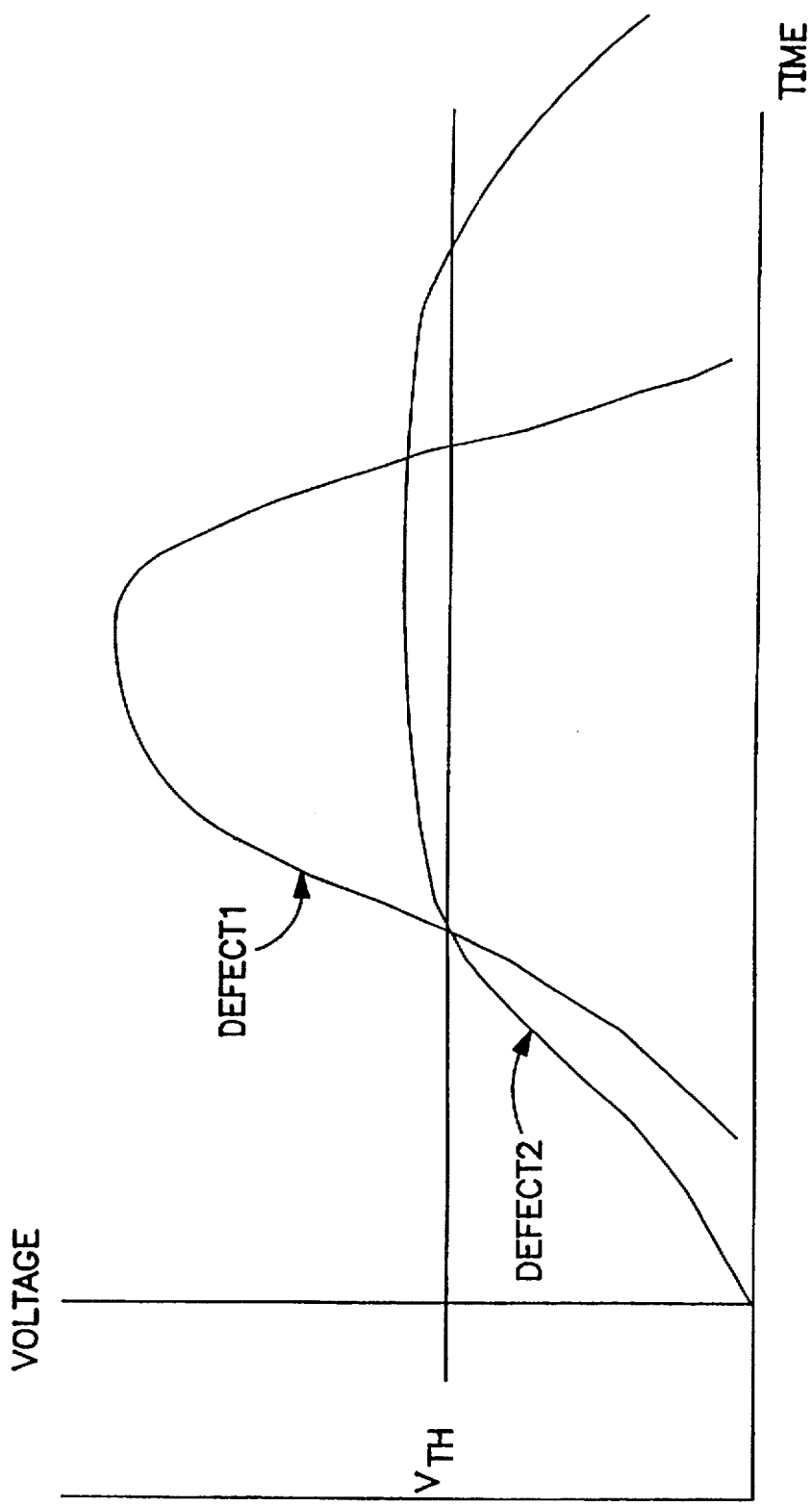
FIG. 2 illustrates two analog voltage signals that are representative of two types of surface defects.

Turning again to FIG. 4, channel 86 and 88 each have an analog output 87 and 89, respectively. Signals 87 and 89 are received by analog to digital peak detectors 92 and 94. The digital outputs 93 and 95 of detectors 92 and 94 are coupled to a DSP 96 via a bus 97. The output 98 of DSP 96 may be coupled to a host interface to further process the results of the DSP calculations. It is understood that detectors 92 and 94 and DSP 96 function in a manner similar to those described in conjunction with the embodiment of FIG. 1.

Figure 5:
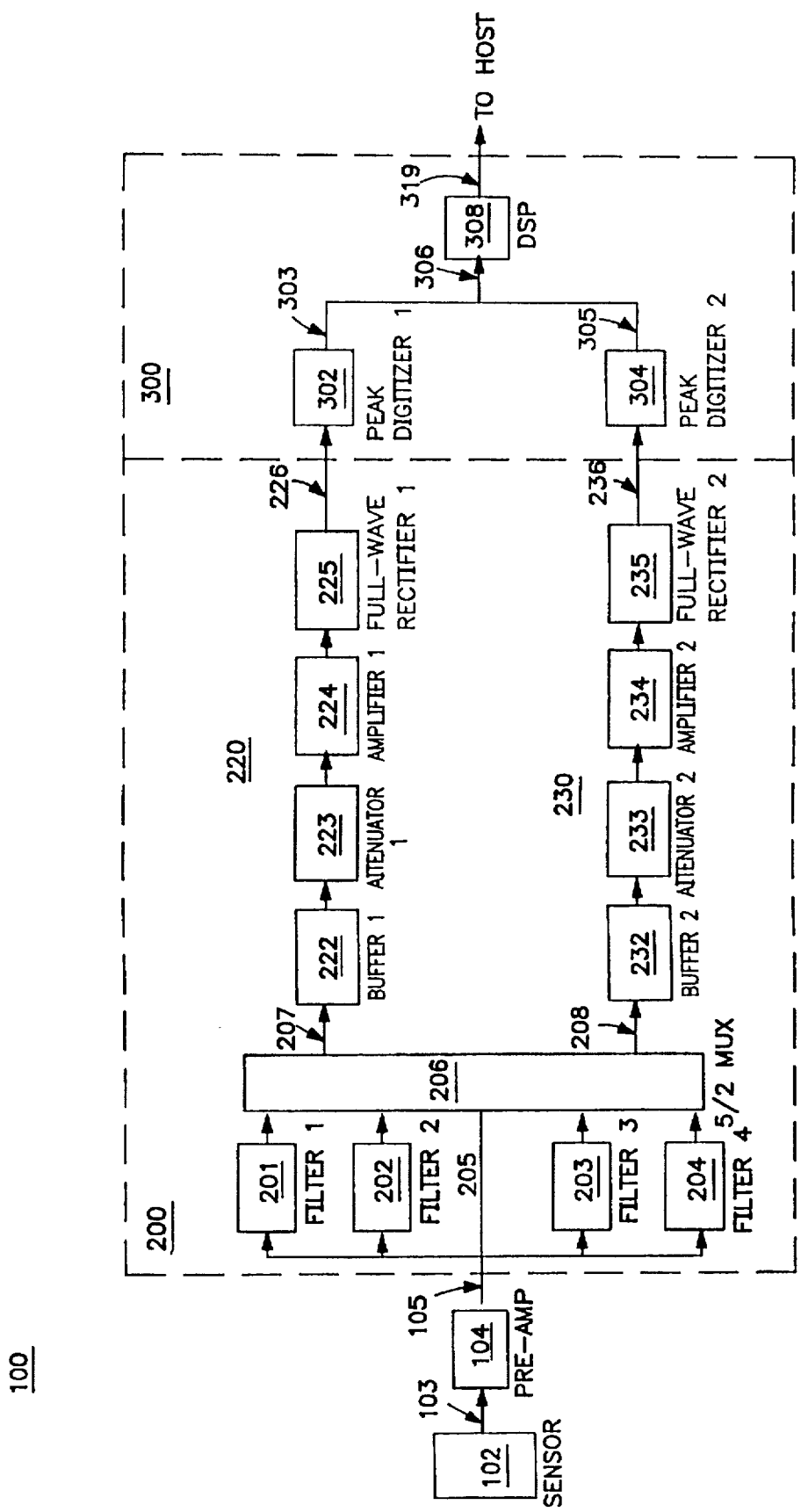
FIG. 5 illustrates a block diagram of yet another embodiment of the present invention.

FIG. 5 illustrates yet another embodiment of the present invention. The testing apparatus 100 of FIG. 5 includes a sensor 102 having an analog signal output 103 that is representative of a defect detected on the surface of a magnetic disk or other data recording medium. Signal 103 is received by a pre-amplifier 104 consisting of one or more amplifiers that are commonly known in the art. In one embodiment, pre-amplifier 104 comprises a digital piezo and acoustical emission pre-amplifier having a gain of 100. The analog output 105 of pre-amplifier 104 is coupled to an analog circuit 200 possessing two processing channels 220 and 230. In one embodiment, signal 105 is coupled to circuit 200 by a plurality of bandpass filters 201–204 and an unfiltered input 205. Bandpass filters 201–204 and unfiltered input 205 serve as inputs to a multiplexer 206. Multiplexer 206 includes two outputs 207 and 208, each serving as an input to analog processing channels 220 and 230, respectively. Output signals 207 and 208 are selected from among multiplexer inputs 201–205. Selection is based upon particular user testing requirements. For example, when a low grade magnetic disk having relatively high bumps is tested, a high frequency filtered input may be selected to serve as an input to one or to both of channels 220 or 230 for processing. The multiplexer output signal may be selected manually or be programmable by a computer. In one embodiment bandpass filters 201–204 have ranges of 30–200, 201–400, 401–600, and 601–800 KHz, respectively. It is appreciated, however, that any of a number of other frequency ranges may be selected. It is also understood that the number of inputs and outputs to multiplexer 206 may vary depending upon the particular testing requirements. For instance, if a higher resolution signal is desired, a larger number of filtered inputs and a larger number of analog signal processing channels may be used.

As shown in FIG. 5, analog processing channels 220 and 230 each possess a number of components that are used to process analog signals 207 and 208 before the signals are received by a digital circuit 300. In one embodiment each of channels 220 and 230 includes a buffer 222 and 232, an attenuator 223 and 333, an amplifier 224 and 234 and a full wave rectifier 225 and 235. In one embodiment, attenuators 223 and 233 may include a quad multiplier comprising an 8-bit digital-analog attenuator. It is appreciated, however, that any of a number of other known scaling devices in the art may be used in lieu of attenuator described above. The purpose of attenuators 223 and 233 is to scale the analog input signal and to normalize the analog signal generated by different sensors. Attenuators 223 and 233 and amplifiers 224 and 234 are selected to have the full dynamic range of the analog to digital peak detectors 302 and 304. Although an analog signal processing circuit 200 has been described having a buffer, an attenuator, an amplifier and a full wave rectifier, it is appreciated that the use of these specific components is not necessary in the implementation of the present invention. For example, although the full wave rectifiers 225 and 235 simplify the digital conversion and processing of the channel output signals 226 and 236, they are not essential to the implementation of the present invention. Moreover, it is appreciated that a variety of other well known components in the art may be used to within the analog signal processing circuit 200 without deviating from the spirit or scope of the present invention.

The analog output signals 226 and 236 of processing channels 220 and 230 are received by analog to digital peak detectors 302 and 303. The digital outputs 303 and 305 of detectors 302 and 304 are coupled to a DSP 308 via a bus 306. The output 310 of DSP 308 may be coupled to a host interface to further process the results of the DSP calculations. It is understood that detectors 302 and 304 and DSP 308 function in a manner similar to those described above in conjunction with the embodiment of FIG. 1.

In the foregoing discussion, the DSP has been described as residing within the same digital circuit as the peak detector. This configuration permits real-time post processing of the digital data generated by the peak detectors. It should be noted, however, that to implement the present invention the DSP may be remotely located from the peak detector. Also note that although one type of analog to digital peak detector has been described herein that any of a number of peak digitizers may be used in the implementation of the present invention.

Whereas many alternations and modifications to the present invention will no doubt become apparent to the person of ordinary skill in the art after having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

What is claimed is:

1. An apparatus for detecting surface defects on a data recording medium, said apparatus comprising:
    a sensor for detecting said surface defects on said recording medium, said sensor outputting an analog signal representative of the detected surface defects;
    a peak detecting circuit for detecting and converting a peak of said analog signal into digital data, said peak detecting circuit utilizing a plurality of threshold levels to profile the surface defect.

2. The apparatus of claim 1 further comprising an electronic analyzer for receiving and processing said digital data to determine a peak amplitude of a surface defect detected on said data recording medium.

3. The apparatus of claim 1 further comprising an electronic analyzer for receiving and processing the digital data to determine the length of the surface defect.

4. The apparatus of claim 1 further comprising an electronic analyzer for receiving and processing said digital data to determine an average peak power produced by said sensor when said sensor encounters said surface defects.

5. The apparatus of claim 1 wherein said sensor comprises a piezo-electric transducer.

6. The apparatus of claim 1 wherein said sensor comprises an acoustic emission sensor.

7. The apparatus of claim 1 wherein said peak detection circuit comprises an analog to digital peak detector.

8. The apparatus of claims 2, 3 or 4 wherein said electronic analysis means comprises a digital signal processor.

9. The apparatus of claim 1 wherein said data recording medium comprises a magnetic recording disk.

10. A signal processing circuit comprising:
    a sensor for detecting surface defects on a data recording medium, said sensor having an analog signal output representative of the detected surface defects;
    an analog signal processing circuit having a plurality of channels wherein one of said channels receives and processes said analog signal when the frequency of said signal is within a predetermined range; and
    a peak detecting circuit for receiving said analog signal from one of said channels, said peak detecting circuit detecting and converting a peak of the analog signal into digital data.

11. The signal processing circuit of claim 10 further comprising an electronic analyzer for receiving and processing said digital data to determine a peak amplitude of a detected surface defect on said data recording medium.

12. The signal processing circuit of claim 10 further comprising an electronic analyzer for receiving and processing said digital data to determine an average peak amplitude of said surface defects on said data recording medium.

13. The apparatus of claim 10 further comprising an electronic analyzer for receiving and processing said digital data to determine an average peak power produced by said sensor when said sensor encounters said surface defects.

14. The signal processing circuit of claim 10 wherein said sensor comprises a piezo-electric transducer.

15. The signal processing circuit of claim 10 wherein said sensor comprises an acoustic emission sensor.

16. The signal processing circuit of claim 10 wherein said peak detection circuit comprises an analog to digital peak detector.

17. The signal processing circuit of claims 11, 12 or 13 wherein said electronic analysis means comprises a digital signal processor.

18. The apparatus of claim 10 wherein said data recording medium comprises a magnetic recording disk.

19. An apparatus for detecting defects on a rotating data recording medium comprising:
    a slider having a sensor for detecting said surface defects on said recording medium, said sensor having an analog signal output representative of the detected surface defects;
    a first circuit for processing said analog signal, said first circuit having a first channel and a second channel, said first channel receiving and processing said analog signal when the frequency of said signal is within a first predetermined range, said second channel receiving and processing said analog signal when the frequency of said signal is within a second predetermined range; and
    a second circuit for receiving said analog signal from either of said first or second channels, said second circuit determining the peak value of said analog signal and converting said peak value into digital data.

20. The apparatus of claim 19 further comprising electronic analysis means for receiving and processing said digital data to determine a peak amplitude of a detected surface defect on said data recording medium.

21. The apparatus of claim 19 further comprising electronic analysis means for receiving and processing said digital data to determine an average peak amplitude of said surface defects on said data recording medium.

22. The apparatus of claim 19 further comprising electronic analysis means for receiving and processing said digital data to determine an average peak power of said surface defects.

23. The apparatus of claim 19 wherein said sensor comprises a piezo-electric transducer.

24. The apparatus of claim 19 wherein said sensor comprises an acoustic sensor.

25. The apparatus of claim 19 wherein said peak detection circuit comprises an analog to digital peak detector.

26. The apparatus of claims 20, 21 or 22 wherein said electronic analysis means comprises a digital signal processor.

27. The apparatus of claim 19 wherein said data recording medium comprises a magnetic recording disk.

28. A method for determining the surface condition of a data recording medium comprising the steps of:
    a) detecting a surface defect;
    b) producing an analog signal representative of said surface defect;
    c) determining the peak value of said analog signal; and
    d) converting said peak value of said analog signal into a profile of said surface defect.

29. The method of claim 28 further comprising the step of determining the peak amplitude of said surface anomaly.

30. The method of claim 28 wherein said step of detecting said surface defects includes flying a slider having a sensor over the surface of said data recording medium.

31. The apparatus of claim 1 wherein said peak detecting circuit includes a plurality of comparators.

32. The apparatus of claim 1 wherein said peak detecting circuit includes a resistor ladder.

33. An apparatus for profiling a surface defect on a rotating disk comprising:
- a sensor for detecting a defect on the rotating disk and outputting an analog signal;
- a peak digitizer which receives the analog signal and converts a peak of said analog signal into digital data;
- a digital signal processor which operates on the digital data to determine a profile of the surface defect.

34. A method for profiling a surface defect on a rotating disk comprising the steps of:
- a) detecting the surface defect on the rotating disk;
- b) producing an analog signal representative of said surface defect;
- c) analyzing the frequency components of the analog signal and inputting the resulting frequency analysis into a digital signal processor;
- d) processing the resulting frequency analysis to generate a profile of the surface defect.

* * * * *